Sept. 28, 1965 M. COOPERMAN 3,209,170

NEGATIVE RESISTANCE DIODE CIRCUIT

Filed Nov. 6, 1962

INVENTOR:

MICHAEL COOPERMAN

By Carl V. Olson

Attorney 3,209,170

NEGATIVE RESISTANCE DIODE CIRCUIT

Michael Cooperman, Cherry Hill, N.J., assignor to Radio Corporation of America, a corporation of Delaware Filed Nov. 6, 1962, Ser. No. 235,781
5 Claims. (Cl. 307—88.5)

This invention relates to negative resistance diode or tunnel diode circuits, and particularly to means for preventing the deflection of an electrical disturbance from a circuit receiving a signal pulse back to a circuit supplying the signal pulse.

Tunnel diodes are two-terminal devices wherein the same terminals serve as signal input and signal output terminals. Cascaded tunnel diode circuits often have unidirectional interstage couplings to insure the progression of a signal in the desired direction from one cascaded stage to the next. Rectifiers such as tunnel rectifiers (also called backward diodes) have been used between tunnel diode stages for this purpose. The tunnel rectifier presents a low impedance for the coupling of a signal pulse of one polarity from one tunnel diode stage to the next, and presents a high impedance preventing the coupling of a signal pulse in the reverse direction.

However, the coupling of a signal pulse from one tunnel diode circuit through a tunnel rectifier to a following tunnel diode circuit does not preclude the reflection of an electrical disturbance back to the first tunnel diode circuit. This is because a tunnel rectifier conveys signal variations in both directions when the tunnel rectifier is biased (as by the signal pulse itself) to present a low impedance. The reflection back of an electrical disturbance is caused by the switching of the tunnel diode circuit receiving the signal to its other voltage state. This reflection of a disturbance may not have serious consequences when the sending and receiving tunnel diode circuits are physically very close together, but may cause a second false triggering of the receiving circuit if the time taken by a signal going from the sending circuit to the receiving circuit is significant in relation to the fast operational time cycles of the tunnel diode circuits.

A tunnel diode can be made to switch from one of its voltage states to the other in a very short time, such as a fraction of a nanosecond (a fraction of a milli-microsecond), in response to a signal pulse which may be one or a few nanoseconds wide. One nanosecond is the time it takes for an electrical signal to go about eight inches along a wire or transmission line. It is often desirable, such as in electronic data processing apparatus, to have coupled tunnel diode circuits separated by distances in the order of a few, several or more inches, and then, especially, means are needed to prevent reflected disturbances.

It is an object of this invention to provide an improved negative resistance diode circuit having a pulse signal input circuit constructed to reduce or eliminate the reflection back of electrical disturbances.

It is another object to provide an improved means for coupling the output of a negative resistance diode circuit to the input of another negative resistance diode circuit located a distance away which is significant in relation to the operational times of the circuits.

It is a further object to provide improved unidirectional coupling means between tunnel diode circuits.

It is yet another object to provide a tunnel diode circuit having an improved input circuit.

According to an example of the invention, a tunnel diode circuit includes a signal input terminal and a tunnel diode having a signal electrode. A reflection preventing signal input circuit includes a first tunnel rectifier (also called a backward diode) connected from the signal input terminal to the signal electrode of the tunnel diode, and a second tunnel rectifier connected from the signal input terminal to a point of fixed bias potential. The tunnel rectifiers and the tunnel diode are poled and biased so that an input signal passes through the first tunnel rectifier to the tunnel diode until the tunnel diode switches, and thereupon the input signal passes through the second tunnel rectifier so that the signal is thus terminated rather than reflected back to the signal source.

Figure 1:
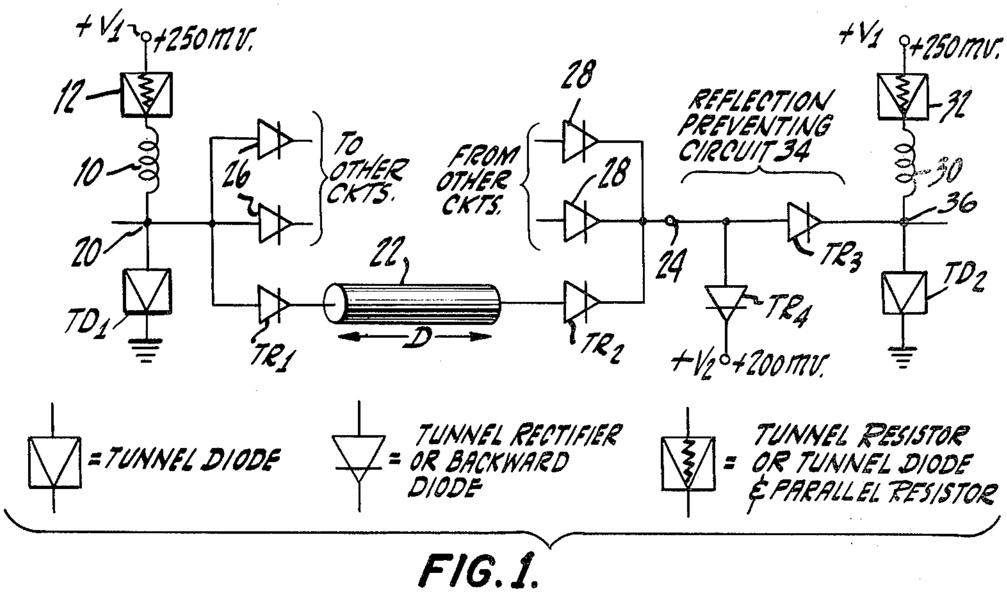
FIGURE 1 is a diagram of two tunnel diode circuits having a signal coupling path therebetween which includes a reflection preventing circuit.
Figure 3:
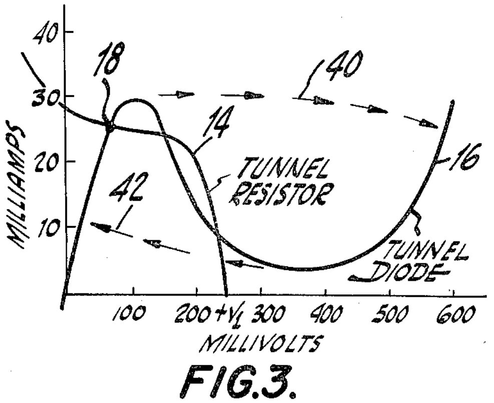
FIGURE 3 is a current-voltage chart illustrating typical characteristics of the tunnel diodes and tunnel resistors in the circuit of FIGURE 1.

Reference will now be made in greater detail to FIGURE 1 of the drawing. A first monostable tunnel diode circuit includes a tunnel diode $TD_1$, an inductor 10 and a tunnel resistor 12 all connected in series between a point of reference potential such as ground and a $+V_1$ terminal of a voltage source (not shown). The tunnel resistor 12 may be constituted by a tunnel diode shunted by a resistor having a value equal to the dynamic negative resistance of the tunnel diode to provide a current-voltage characteristic 14 as shown in FIGURE 3. The tunnel diode $TD_1$ has the characteristic 16 in FIGURE 3. The circuit is biased to provide a stable operating point 18 at the intersection of the characteristic curves 14 and 16.

The signal input-output terminal 20 of the monostable circuit of tunnel diode $TD_1$ is coupled through a tunnel rectifier $TR_1$, a signal path or transmission line 22 and a tunnel rectifier $TR_2$ to a signal terminal 24. The tunnel rectifiers $TR_1$ and $TR_2$ may have a current-voltage characteristic as shown by the curve TR in FIGURE 4. The signal terminal or signal electrode 20 of tunnel diode $TD_1$ also may be coupled through tunnel rectifiers 26 to other tunnel diode circuits (not shown). Other tunnel diode circuits (not shown) are coupled through tunnel rectifiers 28 to the signal terminal 24. The arrangement illustrated typifies arrangements of tunnel diode circuits as employed for performing logic functions in data processing apparatus.

The signal terminal 24 may be viewed as the signal input terminal of a second monostable tunnel diode circuit including tunnel diode $TD_2$, inductor 30 and tunnel resistor 32, all connected in series across a voltage source (not shown) having ground and $+V_1$ terminals. A reflection preventing circuit 34 is interposed between the signal terminal 24 and the signal electrode 36 of tunnel diode $TD_2$. The reflection preventing circuit 34 is preferably physically located very close to the circuit of tunnel diode $TD_2$, and therefore the circuit 34 may be viewed as a signal input circuit for the circuit of tunnel diode $TD_2$. Alternatively, the reflection preventing circuit 34 may be viewed as a dynamic termination for the signal coupling path from the circuit of tunnel diode $TD_1$.

Figure 4:
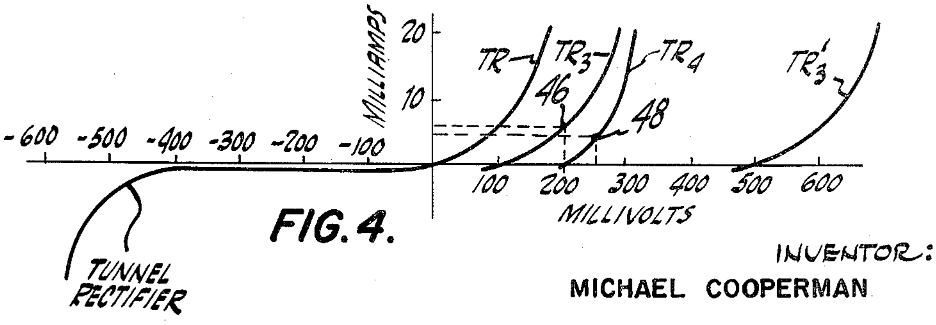
FIGURE 4 is a current-voltage chart illustrating the characteristics of tunnel rectifiers in the circuit of FIGURE 1.

The reflection preventing circuit 34 includes a tunnel rectifier $TR_3$ connected from the input signal terminal 24 to the signal electrode 36 of tunnel diode $TD_2$. The circuit 34 also includes a tunnel rectifier $TR_4$ connected from the input signal terminal 24 to the $+V_2$ terminal of a voltage source (not shown) referenced to ground. The tunnel rectifiers $TR_3$ and $TR_4$ are poled to provide conductive paths for signal pulses from input signal terminal 24 when certain conditions exist, as will be described. They also may be described in the example of FIGURE 1 as poled to conduct easily in the same sense from their common terminal 24. The tunnel rectifier $TR_4$ is preferably selected to have a steeper positive resistance region, as shown in FIGURE 4, than tunnel rectifier $TR_3$.

The operation of the circuits of FIGURE 1 will now be described starting first with a description of the operation assuming the reflection preventing circuit 34 to be absent, and then concluding with a description of the operation when the circuit 34 is present. The monostable circuit of tunnel diode $TD_1$ is normally biased with the tunnel diode $TD_1$ in its low voltage state represented by the operating point 18 in FIGURE 3. An input trigger signal applied to the signal terminal 20 causes the tunnel diode to go through a monostable cycle of operation wherein the operating point switches along a path such as that represented by the arrows 40 to its high voltage state, and then switches back along a path such as that represented by arrows 42 back to its low voltage state. The resulting voltage pulse at the signal terminal 20 is as represented by the idealized voltage waveform of FIGURE 2*a*. The positive voltage signal pulse has a polarity to render tunnel rectifiers $TR_1$ and $TR_2$ conductive. The signal pulse, therefore, passes through tunnel rectifier $TR_1$, transmission line 22 and tunnel rectifier $TR_2$, and arrives at the signal terminal 24 at a time represented by the waveform of FIGURE 2*b* which is delayed by the amount D of the transmission line 22 compared with the original signal pulse of FIGURE 2*a*. It is assumed that the tunnel rectifier $TR_1$ is close to the tunnel diode $TD_1$ and that the tunnel rectifier $TR_2$ is close to the tunnel diode $TD_2$, so that the only significant propagation delay is due to the presence of the transmission line 22. The transmission line 22 may, for example, have a length of several inches which provides a delay in the order of one nanosecond. This delay is significant in relation to the width of the signal pulse which may be a few nanoseconds.

Figure 2:
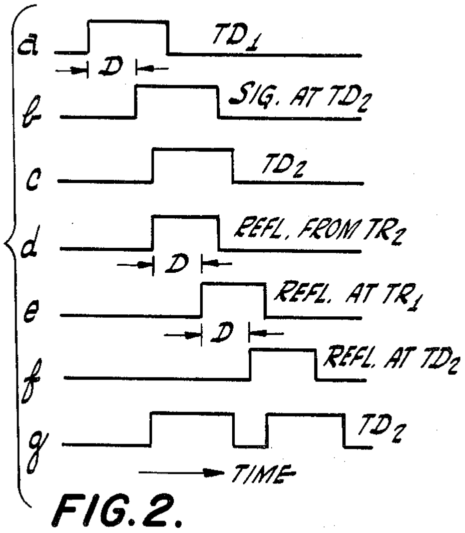
FIGURE 2 is a chart illustrating idealized waveforms which will be referred to in describing the reflection difficulties which are avoided by the construction according to the invention.

It is presently assumed that tunnel rectifiers $TR_3$ and $TR_4$ of the circuit 34 are absent and that the signal input terminal 24 is connected directly to the signal electrode 36 of tunnel diode $TD_2$. The signal applied to tunnel diode $TD_2$ (FIGURE 2*b*) causes the circuit of tunnel diode $TD_2$ to go through a monostable cycle of operation such as has been described in connection with tunnel diode $TD_1$. FIGURE 2*c* represents the output voltage waveform of the circuit of tunnel diode $TD_2$, the waveform being delayed about a half of a nanosecond with relation to the leading edge of the received signal pulse of FIGURE 2*b*.

When the tunnel diode $TD_2$ switches to its high voltage state, the tunnel rectifier $TR_2$ becomes reversed biased so that it presents a high impedance to the remaining portion of the input signal being received. The high impedance of tunnel rectifier $TR_2$ makes the transmission line 22 appear to have an open-circuited end, with the result that the remainder of the signal pulse, represented by the waveform of FIGURE 2*d*, is reflected back through the transmission line 22 to the tunnel rectifier $TR_1$ with a delay equal to D. In the meantime, tunnel diode $TD_1$ (FIGURE 2*a*) has returned to its low voltage state causing tunnel rectifier $TR_1$ to be back-biased and nonconductive. Therefore, the reflected signal arriving at tunnel rectifier $TR_1$ (FIGURE 2*e*) is again reflected and arrives at tunnel rectifier $TR_2$ at the time represented by FIGURE 2*f*. In the meantime, tunnel diode $TD_2$ has returned to its low voltage state so that the reflection is conducted through tunnel rectifier $TR_2$ directly to the tunnel diode $TD_2$.

The reflection arriving at tunnel diode $TD_2$ has the very undesirable effect of again triggering the tunnel diode. Therefore, the tunnel diode $TD_2$ provides two output pulses as shown in FIGURE 2*g*, instead of the one desired pulse as shown in FIGURE 2*c*. The reflections may, in fact, continue back and forth causing tunnel diode $TD_2$ to be periodically triggered to operate in an undesired oscillatory manner.

Having shown how the absence of the circuit 34 results in undesired reflection, the operation of the system when the circuit 34 is included will now be described. As before, the signal pulse arrives at terminal 24. Since the tunnel diode $TD_2$ is initially in its low voltage state, the potential of signal electrode 36 is normally at 80 to 100 millivolts above ground. Therefore, the tunnel rectifier $TR_3$ is biased so that the forward portion of its characteristic is located as shown by the curve $TR_3$ in FIGURE 4. The tunnel rectifier $TR_4$ is biased to a higher positive voltage $+V_2$ so that its forward conduction region (which is preferably steeper than that of $TR_3$) occupies the position of curve $TR_4$ in FIGURE 4. The signal voltage pulse which may have an amplitude of 500 millivolts at tunnel diode $TD_1$ is reduced in tunnel rectifiers $TR_1$ and $TR_2$ to a value such as 200 millivolts at signal terminal 24. This value of signal voltage at terminal 24 renders tunnel rectifier $TR_3$ conductive. At the same time, the tunnel rectifier $TR_4$ presents a high impedance and is substantially nonconductive. Therefore, the signal from signal input terminal 24 is conveyed through the tunnel rectifier $TR_3$ to the signal electrode 36 of tunnel diode $TD_2$ triggering the monostable circuit of tunnel diode $TD_2$ into a monostable cycle of operation, as has been described in connection with the circuit of tunnel diode $TD_1$.

As soon as tunnel diode $TD_2$ switches to its high voltage state, which may be at 500 millivolts, the tunnel rectifier $TR_3$ is back-biased so that its forward conduction region occupies the position shown by the curve $TR_3'$ in FIGURE 4. Under these conditions, the tunnel rectifier $TR_3$ presents a high impedance to the remainder of the signal pulse on terminal 24. The high impedance (approximately an open circuit) constituted by the tunnel rectifier $TR_3$ tends to cause a reflection of the signal pulse which adds to the portion of the signal pulse still arriving at tunnel rectifier $TR_3$. The sum of the signal pulse voltage and the reflected pulse voltage tends to be twice the signal pulse voltage. However, this voltage doubling is prevented because a small increase in voltage is sufficient to render tunnel rectifier $TR_4$ conductive. The reflection is thus terminated by a dissipating current flow through tunnel rectifier $TR_4$ into the bias source terminal $+V_2$. The signal pulse is terminated at signal terminal 24 without the generation of disturbing reflections that can otherwise result in false triggering of tunnel rectifier $TR_2$ as has been described. By preventing reflections, the circuit of tunnel diodes $TD_1$ and $TD_2$ may be physically separated and coupled together by a transmission line 22, as is often necessary in apparatus having many tunnel diode circuits.

The reflection preventing circuit 34 is about 90 percent effective (rather than 100 percent effective) in preventing reflection because some increase in voltage at terminal 24 is necessary to change tunnel rectifier $TR_4$ from its non-conducting state to its conducting state. In practice, the circuit 34 reduces the current of the reflected pulse to a value about 10 percent of what it otherwise would be. This small value of reflection is not sufficient, when it returns again to tunnel diode $TD_2$, to cause a false triggering of the current-responsive tunnel diode $TD_2$.

An example of typical conditions in the reflection preventing circuit 34 is as follows: When tunnel diode $TD_2$ is in its low-voltage state, the tunnel diode electrode 36 may be at 100 millivolts and the signal terminal 24 may be at 200 millivolts, with 6 milliamperes flowing through tunnel rectifier $TR_3$, as represented by the point 46 in FIGURE 4. After the tunnel diode $TD_2$ switches to its high-voltage state, the tunnel diode electrode 36 may be at 500 millivolts and the signal terminal 24 may be at about 250 millivolts with about 5.5 milliamperes flowing through tunnel rectifier $TR_4$, as represented by the point 48 in FIGURE 4. The current difference of 0.5 milliampere represents a 10 percent reflection back toward tunnel diode $TD_1$. The reflection, when it again returns to tunnel diode $TD_2$, is further attenuated and is unable to falsely trigger tunnel diode $TD_2$.

The inclusion of the reflection preventing circuit 34 in the system of FIGURE 1 also serves to improve the operation of the system by causing a constant loading on the monostable circuit of tunnel diode $TD_1$. This results in the monostable circuit having a shorter recovery time, which permits operation at a higher repetition rate. A further advantage of the reflection preventing circuit 34 is that it reduces the leakage currents involved in the connection of a plurality of tunnel diode circuits through tunnel rectifiers $TR_2$ and 28 to the input of the monostable circuit of tunnel diode $TD_2$. The reduction of leakage currents, which are due to the gradual rather than abrupt curvature of tunnel rectifier characteristic curves, provides improved reliability of operation with given specified tolerances on circuit values.

What is claimed is:

1. A tunnel diode circuit comprising
- a signal input terminal for signals having a given voltage level,
- a tunnel diode having a signal electrode,
- a first tunnel rectifier coupled from said signal input terminal to said signal electrode,
- a source of fixed bias potential, and
- a second tunnel rectifier coupled from said signal input terminal to said source of bias potential,
- said tunnel diode and tunnel rectifiers being poled and biased to pass a signal from said signal input terminal through said first tunnel rectifier to said tunnel diode to cause the tunnel diode to switch, said source of fixed bias potential having a value to bias said second tunnel rectifier to present a low impedance to the sum of input and reflected input signals.

2. In a tunnel diode circuit including a signal input terminal and including a tunnel diode having a signal electrode, said tunnel diode being biased to switch from one voltage state to the other voltage state in response to an input signal, a signal input circuit comprising
- a first tunnel rectifier coupled from said signal input terminal to said signal electrode, said first tunnel rectifier being poled to present a low impedance to passage of an input signal until said tunnel diode switches to its other voltage state whereupon the rectifier presents a high impedance to the remainder of the input signal, and
- a second tunnel rectifier connected from said signal input terminal to a point of fixed bias potential, said second tunnel rectifier being poled and biased to present a high impedance to said signal and to present a low impedance to the sum of said remainder of the input signal and a reflected signal caused by the high impedance of said first tunnel rectifier, whereby to prevent a reflection from said signal input terminal.

3. The combination of
- a first tunnel diode circuit,
- a second tunnel diode circuit having a signal input terminal and a tunnel diode signal electrode,
- a signal coupling path from the output of said first tunnel diode circuit to the signal input terminal of said second tunnel diode circuit, and
- a reflection preventing input circuit in said second tunnel diode circuit including a first tunnel rectifier connected from said signal input terminal to said tunnel diode signal electrode, and a second tunnel rectifier connected from said signal input terminal to a point of fixed bias potential, said first tunnel rectifier being poled and biased so that said first tunnel rectifier presents a low impedance path for an input signal solely until said second tunnel diode switches, whereupon said first tunnel rectifier changes to a high impedance path, said second tunnel rectifier being poled and biased to present a high impedance to said input signal and to present a low impedance to the sum of said input signal and a reflected input signal which is present after said second tunnel diode has switched.

4. The combination of
- a first tunnel diode circuit,
- a second tunnel diode circuit having a signal input terminal for signals of given amplitude, and a tunnel diode signal electrode,
- a signal coupling path from the output of said first tunnel diode circuit to the signal input terminal of said second tunnel diode circuit, said path including a first rectifier, a transmission line and a second rectifier, in the order named, and
- a reflection preventing input circuit in said second tunnel diode circuit including a third rectifier connected from said signal input terminal to said tunnel diode signal electrode, and a fourth rectifier connected from said signal input terminal to a point of fixed bias potential, said fourth rectifier being poled and biased to present a high impedance to input signals of said given amplitude and to present a low impedance to a reflected signal superimposed on said input signal.

5. The combination of
- a first tunnel diode circuit,
- a second tunnel diode circuit having a signal input terminal and a tunnel diode signal electrode,
- a signal coupling path from the output of said first tunnel diode circuit to the signal input terminal of said second tunnel diode circuit, said signal coupling path including a first tunnel rectifier, a transmission line and a second tunnel rectifier, in the order named, and
- a reflection preventing input circuit in said second tunnel diode circuit including a third tunnel rectifier connected from said signal input terminal to said tunnel diode signal electrode, and a fourth tunnel rectifier connected from said signal input terminal to a point of fixed bias potential, said third and fourth tunnel rectifiers being poled and biased so that said third tunnel rectifier presents a low impedance path for an input signal solely until said second tunnel diode switches, whereupon said third tunnel rectifier changes to a high impedance path, and so that said fourth tunnel rectifier presents a high impedance to said input signal and a low impedance to the sum of said input signal and a reflected signal which is present after said second tunnel diode has switched.

References Cited by the Examiner

UNITED STATES PATENTS

| | | | |
|---|---|---|---|
| 3,119,985 | 1/64 | Kaufmann | 307—88.5 |
| 3,142,765 | 7/64 | Wine | 307—88.5 |

DAVID J. GALVIN, *Primary Examiner.*